United States Patent
Hynecek

(10) Patent No.: US 8,159,011 B2
(45) Date of Patent: Apr. 17, 2012

(54) COMPLEMENTARY METAL OXIDE SEMICONDUCTOR (CMOS) IMAGE SENSOR WITH EXTENDED PIXEL DYNAMIC RANGE INCORPORATING TRANSFER GATE WITH POTENTIAL WELL

(75) Inventor: Jaroslav Hynecek, Allen, TX (US)

(73) Assignee: Intellectual Ventures II LLC, Wilmington, DE (US)

( * ) Notice: Subject to any disclaimer, the term of this patent is extended or adjusted under 35 U.S.C. 154(b) by 745 days.

(21) Appl. No.: 11/711,821

(22) Filed: Feb. 28, 2007

(65) Prior Publication Data

US 2007/0257280 A1  Nov. 8, 2007

(30) Foreign Application Priority Data

May 4, 2006 (KR) .................. 10-2006-0040713

(51) Int. Cl.
*H01L 31/102* (2006.01)

(52) U.S. Cl. ........ 257/292; 257/339; 257/345; 257/461; 257/463

(58) Field of Classification Search .................. 257/292, 257/462, 461, 339, 345, 463
See application file for complete search history.

(56) References Cited

U.S. PATENT DOCUMENTS

| | | | | |
|---|---|---|---|---|
| 5,479,367 A | * | 12/1995 | Maurelli et al. | 365/182 |
| 5,654,569 A | * | 8/1997 | Ko | 257/335 |
| 6,570,201 B2 | | 5/2003 | Shim | 257/292 |

FOREIGN PATENT DOCUMENTS

| | | |
|---|---|---|
| JP | 11-274450 | 10/1999 |
| JP | 2000232216 | 8/2000 |
| JP | 2002325204 | 11/2002 |
| JP | 2006093517 | 4/2006 |
| KR | 2002/0088881 A | 11/2002 |
| KR | 2005/0018512 A | 2/2005 |
| KR | 2005/0114752 A | 12/2005 |

* cited by examiner

*Primary Examiner* — Michael Shingleton
(74) *Attorney, Agent, or Firm* — McAndrews, Held & Malloy, Ltd.

(57) ABSTRACT

A charge transfer transistor includes: a first diffusion region and a second diffusion region; a gate for controlling a charge transfer from the first diffusion region to the second diffusion region by a control signal; and a potential well incorporated under the gate, wherein the first diffusion region is a pinned photodiode. A pixel of an image sensor includes: a photodiode for generating and collecting a photo generated charge; a floating diffusion region for serving as a photo generated charge sensing node; a transfer gate for controlling a charge transfer from the photodiode to the floating diffusion region by a control signal; and a potential well incorporated under the transfer gate.

16 Claims, 3 Drawing Sheets

(Prior Art)

(Prior Art)

COMPLEMENTARY METAL OXIDE SEMICONDUCTOR (CMOS) IMAGE SENSOR WITH EXTENDED PIXEL DYNAMIC RANGE INCORPORATING TRANSFER GATE WITH POTENTIAL WELL

CROSS-REFERENCE TO RELATED APPLICATIONS

The present invention claims priority of Korean patent application number 10-2006-0040713, filed on May 4, 2006 which is incorporated by reference in its entirety.

BACKGROUND OF THE INVENTION

The present invention relates to a solid-state image sensor having an improved performance with a higher charge well capacity which results in a higher dynamic range (DR) and a better signal to noise ratio (SNR), and more particularly to a complementary metal oxide semiconductor (CMOS) image sensor.

A typical pixel of the CMOS image sensor includes a photodiode, more precisely a pinned photodiode, and four transistors. The photodiode collects a photo-generated charge that is later transferred at a suitable moment by a charge transfer transistor onto a floating diffusion (FD) node which detects the charge. Prior to the charge transfer, however, the FD node must be first reset by a reset transistor to a suitable reference voltage, which is usually a terminal bias voltage, Vdd, or a bias close to this level. The reset causes kTC noise, which is normally added to a signal appearing on the FD node. Thus, it is necessary to read a voltage on the FD node twice, before and after the charge transfer. This operation is called a correlated double sampling (CDS) procedure and the CDS procedure allows sensing of only the voltage difference of the FD node caused by the charge transferred from the photodiode. A source follower (SF) transistor with a gate connected to the FD node, one terminal connected to the Vdd and the other terminal connected to a common column sense line via an addressing transistor performs sensing of the voltage on the FD node. For this reason, it is necessary to incorporate the four transistors in each pixel of a standard CMOS image sensor. The four transistors (4T) pixel circuit with the pinned photodiode is proposed in U.S. Pat. No. 5,625,210 issued to Lee, entitled "Active Pixel Sensor Integrated with a Pinned Photodiode".

In modern CMOS sensor designs, circuits where several photodiodes may be shared are used as can be found for an example in U.S. Pat. No. 6,657,665B1 issued to Guidash, entitled "Active Pixel Sensor with Wired Floating Diffusions and Shared Amplifier". In this patent, a dual pixel includes two photodiodes located in the neighboring rows of a sensor image array that share the same circuit. The shared photodiode concept can result in having only two metal bus lines in the row direction and two metal bus lines in the column direction per photodiode as shown in FIG. 1. The shared photodiode concept is very useful for designing small pixels since spacing and width of the metal lines determine a minimum pixel size. The operation of the shared photodiode pixel circuit can be easily understood from a simplified schematic diagram of the circuit 100 shown in FIG. 1. Two photodiodes 101 and 102 are connected through the respective charge transfer transistors 103 and 104 to a FD node 114 which detects charge. The FD node 114 is reset by a reset transistor 105 to a voltage level appearing on a Vdd node 108. The Vdd node 108 is connected to a column Vdd bus line 115. Gates of the charge transfer transistors 103 and 104 are biased through the respective horizontal bus lines 110 and 111, and a gate of the reset transistor 105 is biased through a horizontal bus line 109. A gate control signal Tx1 of the charge transfer transistor 103 is transferred through the horizontal bus line 110, and a gate control signal Tx2 of the charge transfer transistor 104 is transferred through the horizontal bus line 111. Also, a gate control signal Rx of the reset transistor 105 is transferred through the horizontal bus line 109. The FD node 114 is connected to a gate of a source follower (SF) transistor 106 that senses a voltage on the FD node 114. A terminal of the SF transistor 106 is connected to the Vdd node 108, thereby being connected to the Vdd column bus line 115. An output of the SF transistor 106 is connected through an addressing transistor 107 to a common column sense line 113. A horizontal bus line 112 controls a bias of the addressing transistor 107. A gate control signal Sx of the addressing transistor 107 is transferred through the horizontal bus line 112. As shown in FIG. 1, there are only two vertical (column) lines, the Vdd bus line 115 and a column sense line 113. There are also only two horizontal lines per photo site.

In order to better understand the operation of the 4T pixel, FIG. 2 illustrates a cross-sectional view of a simplified device. The simplified device 200 includes a single pinned photodiode 205, and a charge transfer transistor and a reset transistor corresponding to the photodiode 205. A source follower (SF) transistor 201 and an addressing transistor 202 are shown only schematically including connections of the SF transistor 201 and the addressing transistor 202 to the corresponding circuit nodes. A terminal of the SF transistor 201 is connected to a terminal bus 231. FIG. 2 also includes a potential diagram 206 of the simplified device 200, and the potential diagram 206 illustrates a charge transfer flow from the photodiode 205 into a FD node 203 and finally into a terminal 204, doped with an $N^+$-type impurity, during charge reset. A pixel is formed in a P-type silicon substrate 219 that has pixel isolation trenches 207 formed in the P-type silicon substrate 219 and filled by an oxide 210. Another oxide layer 218 is grown on a top portion of the substrate 219 that isolates a gate 211 of a charge transfer transistor and a gate 212 of a reset transistor from the substrate 219. The gates 211 and 212 of the charge transfer transistor and the reset transistor are connected to the respective horizontal bus lines 213 and 214 that supply a required bias to the gates 211 and 212. Gate control signals Tx and Rx of the charge transfer transistor and the reset transistor are transferred through the horizontal bus lines 213 and 214, respectively. The pinned photodiode 205 is formed in the substrate 219 by a $P^+$-type diffusion region 208 that extends along a sidewall of each of the trenches 207 all the way to the P-type substrate 219 and by an N-type diffusion region 209. It is also possible to use more sophisticated doping profiles as is well known to those skilled in this art. The charge transfer transistor with the gate 211 connects the pinned photodiode 205 to the FD node 203, and the reset transistor with the gate 212 connects the FD node 203 to the terminal 204 doped with the $N^+$-type impurity.

As can be seen from the potential diagram 206 that is located under the cross-sectional view of the simplified device 200 in FIG. 2, potential levels of the potential diagram 206 correspond to each device built into the substrate 219, and the pinned photodiode 205 forms a potential well that accumulates a signal charge 221 during the time when the gate 211 of the charge transfer transistor is off. The off state of the gate 211 of the charge transfer transistor is indicated in the potential diagram 216 by a potential level 222. An overflow charge (blooming current) from the potential well flows via a path 230 through the reset transistor directly to the terminal 204. When the charge transfer transistor is turned on, the potential level 222 under the charge transfer transistor changes to a potential level 223, and the signal charge 221 flows into the FD node 203. The signal charge transferred into the FD node 203 is indicated by a reference numeral 224. The signal charge 224 causes a potential level 225 of the FD node 203 to change to a new potential level 226. The new potential level 226 represents a voltage signal that is sensed by the SF transistor 201. When applying an appropriate bias, i.e., a gate control signal Sx, to a gate of the addressing transistor 202 through a bus line 215, the addressing transistor 202 is turned on and the voltage signal from the SF transistor 201 is transferred to a pixel output bus 216.

The pixel is reset by applying a single reset pulse 217 to the horizontal bus line 214 connected to the gate 212 of the reset transistor. The pixel reset changes a potential level 227 under the reset transistor to a new potential level 228, which allows the signal charge 224 to flow into the terminal 204 doped with the $N^+$-type impurity. The terminal 204 is biased at a Vdd potential level 229, which is fixed by an external device power source and cannot change. Thus, when all the signal charge 224 is transferred to the terminal 204, the FD node 203 resumes the original potential level 225 of the FD node 203. The potential level 225 of the FD node 203 is only approximately equal to the Vdd potential level 229 due to a reset feed through from the gate 212 of the reset transistor and kTC-reset noise. It is therefore desirable to use the CDS procedure to sample both of the potential levels 225 and 226 since a true photo-generated signal is the difference between these two potential levels.

As is now clear from the potential diagram 206, a FD voltage swing is limited on a high side by the Vdd potential level 229 and on a low side by an empty pinned photodiode level 220 of the pinned photodiode 205. When too much signal accumulates in the photodiode 205, not all of the signal can be transferred into the FD node 203, which results in the lower sensitivity and increased noise. It is desirable to have a large voltage swing on the FD node 203 and thus decrease the pinned photodiode level 220, i.e., a pinning voltage level of the pinned photodiode 205. However, the low pinning voltage level results in a low photodiode charge storage capacity, thereby causing a low dynamic range (DR) and a low signal to noise ratio (SNR). Accordingly, it is necessary to find a suitable compromise between these two competing requirements. This compromise then determines an ultimate performance of the pixel that is clearly determined by the maximum Vdd potential level 229 that can be used in the sensor. To have a large Vdd potential level is a disadvantage, since the large Vdd potential level increases the sensor power consumption.

SUMMARY OF THE INVENTION

Embodiments of the present invention are directed toward providing a practical pixel design that can be used in a small pixel and a CMOS image sensor array with a high performance.

In accordance with an aspect of the present invention, there is provided a charge transfer transistor, including: a first diffusion region and a second diffusion region; a gate for controlling a charge transfer from the first diffusion region and to the second diffusion region by a control signal; and a potential well incorporated under the gate, wherein the first diffusion region is a pinned photodiode.

In accordance with another aspect of the present invention, there is provided a pixel of an image sensor, including: a photodiode for generating and collecting a photo generated charge; a floating diffusion region for serving as a photo generated charge sensing node; a transfer gate for controlling a charge transfer from the photodiode to the floating diffusion region by a control signal; and a potential well incorporated under the transfer gate.

In accordance with further aspect of the present invention, there is provided a pixel of an image sensor, including: a photodiode for generating and collecting a photo generated charge; a floating diffusion region for serving as a photo generated charge sensing node; a transfer gate for controlling a charge transfer from the photodiode to the floating diffusion region by a control signal; a potential well incorporated under the transfer gate; a reset transistor for resetting the floating diffusion region; a source follower transistor for amplifying a charge signal of the floating diffusion region; and an addressing transistor for selecting an output of the source follower transistor and providing the selected output as a pixel output.

In accordance with still further aspect of the present invention, there is provided a row shared photo site pixel, including: a floating diffusion region for serving as a sensing node; a plurality of photodiodes connected to the floating diffusion region in parallel; a plurality of transfer gates for controlling charge transfers from the photodiodes to the floating diffusion region by a control signal; and a potential well incorporated by the transfer gates.

DESCRIPTION OF SPECIFIC EMBODIMENTS

According to embodiments of the present invention, a potential well that is formed under a gate of a charge transfer transistor and interfaces with a floating diffusion (FD) node which detects a charge is used. The use of the potential well allows increasing a pinning voltage level of a photodiode above a minimum excursion of the FD node. As a result, it is possible to build a CMOS sensor array with a high charge storage capacity, a high dynamic range (DR), a large signal to noise ratio (SNR), and a very small sized pixel.

More particularly, the potential well is formed under the gate of the charge transfer transistor. Thus, a floating diffusion voltage swing is not limited by a pinning voltage level of a new gate structure of the charge transfer transistor, and as a result, a floating diffusion voltage can swing lower. The potential well under the gate of the charge transfer transistor stores an excess charge, prevents the excess charge from flowing back to the photodiode, and transfers the excess charge onto the FD node when the gate of the charge transfer transistor is turned off. Accordingly, the pinning voltage level can be higher than that of a gate structure formed without the potential well. The higher pinning voltage level results in a higher photodiode well capacity and thus in a higher DR and a higher SNR. Hereinafter, the embodiment of the present invention will be described in more detail with reference to FIG. 3.

Figure 1:
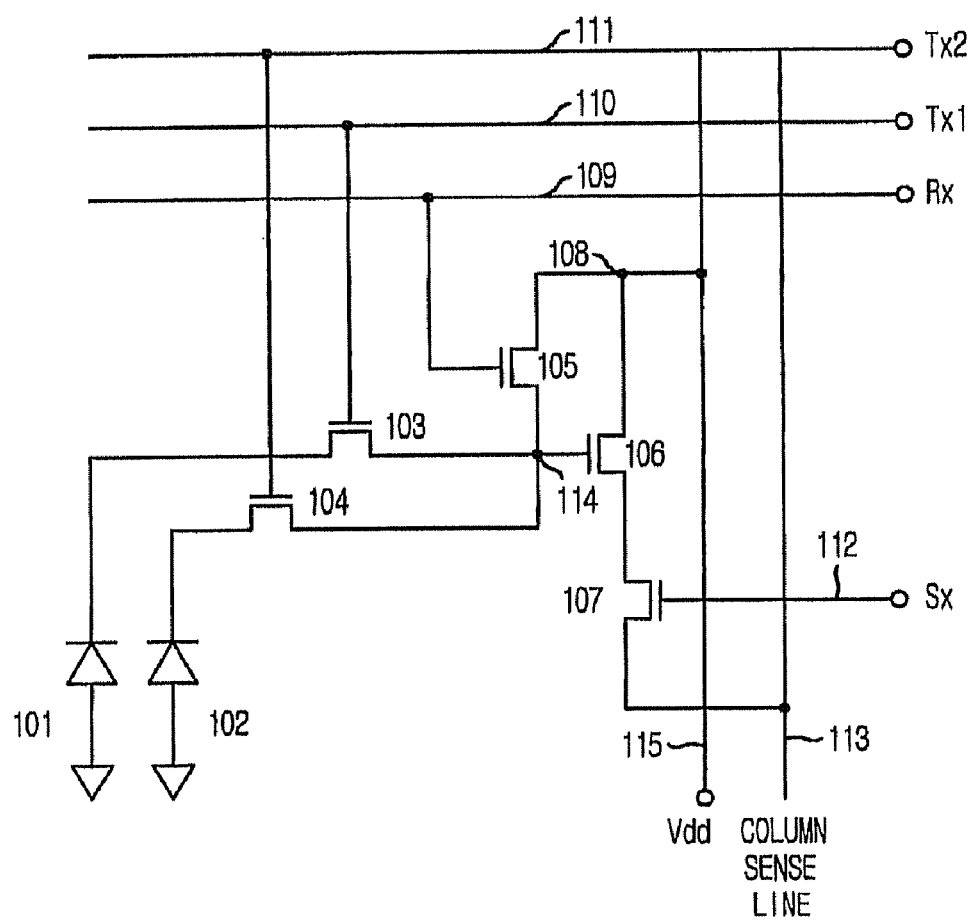
FIG. 1 illustrates a simplified schematic diagram of a typical row-shared pixel circuit having two pinned photodiodes per circuit and operating based on a four transistors (4T) pixel principle.
Figure 2:
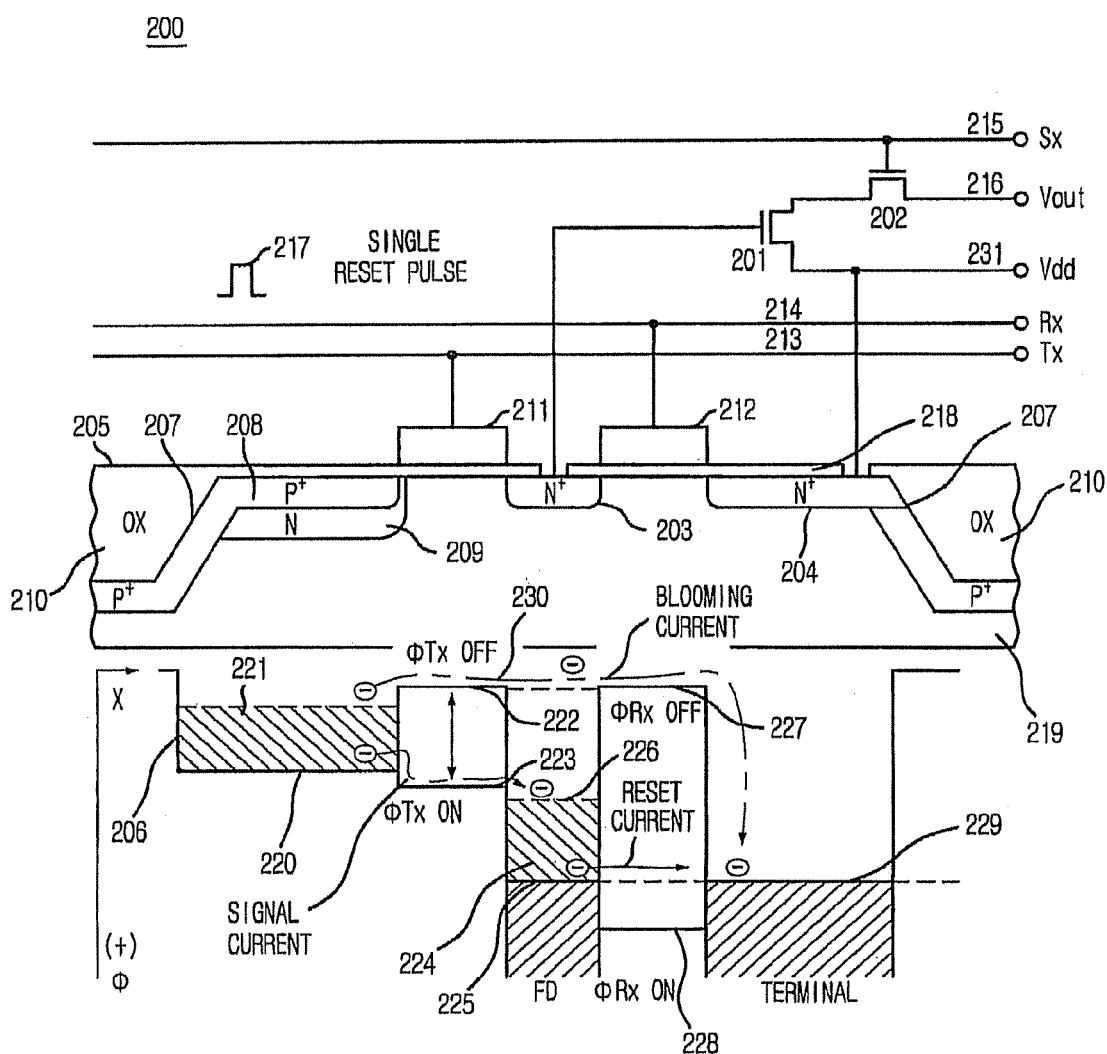
FIG. 2 illustrates a simplified schematic diagram of a typical pixel including a potential diagram showing a flow of an accumulated signal, and a cross-sectional view of a photodiode, a charge transfer transistor, and a reset transistor.
Figure 3:
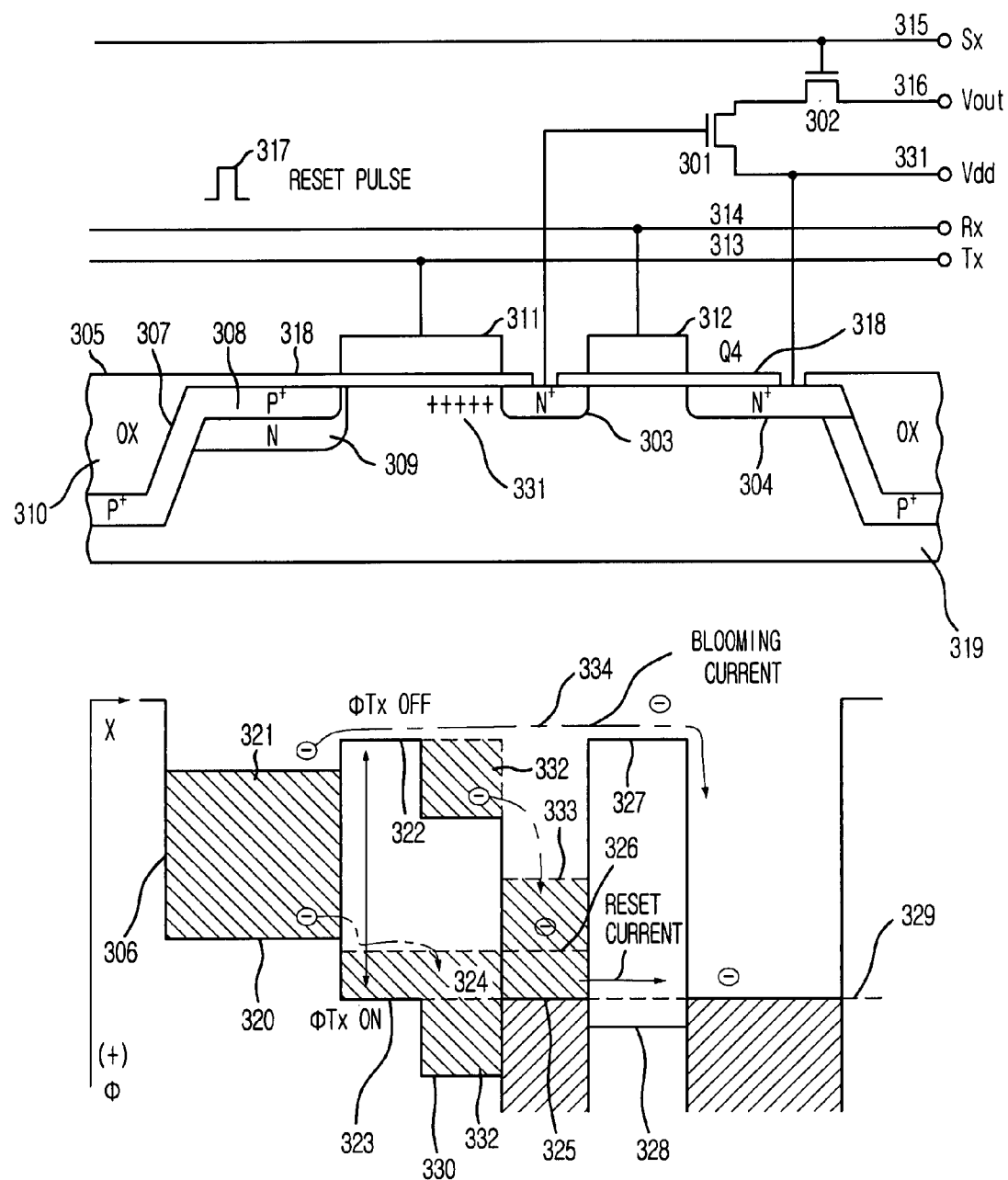
FIG. 3 illustrates a simplified schematic diagram of a pixel including a potential diagram showing a flow of an accumulated signal, and a cross-sectional view of a photodiode, a charge transfer transistor, and a reset transistor in accordance with an embodiment of the present invention.

FIG. 3 illustrates a cross-sectional view of a simplified device. The simplified device 300 includes a single pinned photodiode structure 305, and a charge transfer transistor and a reset transistor corresponding to the pinned photodiode structure 305. A source follower (SF) transistor 301 and an addressing transistor 302 are shown only schematically including connections of the SF transistor 301 and the addressing transistor 302 to the corresponding circuit nodes. A terminal 304 and a terminal of the SF transistor 301 are connected to a bus line 331 to supply a terminal bias Vdd. The simplified device 300 also includes a potential diagram 306, and the potential diagram 306 illustrates a charge transfer flow from a photodiode well into a FD node 303 and finally into the terminal 304 during the charge reset. The pixel is isolated by trenches 307 formed through a shallow trench isolation (STI) process in a P-type silicon substrate 319. The trenches 307 are filled with an oxide 310. Another oxide layer 318 is grown on a top portion of the substrate 319 that isolates a gate 311 of a charge transfer transistor and a gate 312 of a reset transistor from the substrate 319. The gate 311 of the charge transfer transistor and the gate 312 of the reset transistor are connected to the respective horizontal bus lines 313 and 314 that supply the required biases to the gates 311 and 312. Gate control signals Tx and Rx of the charge transfer transistor and the reset transistor are transferred through the horizontal bus lines 313 and 314, respectively. The pinned photodiode 305 is formed in the substrate 319 by a $P^+$-type diffusion region 308 that extends along a sidewall of each of the trenches 307 all the way to the P-type substrate 319 and by an N-type diffusion region 309. The charge transfer transistor with the gate 311 connects the pinned photodiode 305 to the FD node 303 and the reset transistor with the gate 312 connects the FD node 303 to the terminal 304 doped with an $N^+$-type impurity. The charge transfer transistor has an additional N-type implantation region 331 formed under the gate 311 of the charge transfer transistor, thereby forming a potential well on the side of the FD node 303 in the substrate 319.

As can be seen from the potential diagram 306 shown under the cross-sectional view of the simplified device 300, potential levels corresponding to each device that is built into the substrate 319 are shown. The pinned photodiode 305 forms a pinned photodiode potential well that accumulates a signal charge 321 during the time when the gate 311 of the charge transfer transistor is turned off. The off state of the gate 311 of the charge transfer transistor is indicated in the potential diagram 306 by a potential level 322. An overflow charge (a blooming current) from the potential well flows via a path 334 to the terminal 304. When the gate 311 of the charge transfer transistor is turned on, the potential level 322 under the gate 311 of the charge transfer transistor changes to a potential level 323, and the signal charge 321 flows into the FD node 303 doped with an $N^+$-type impurity. The signal charge transferred into the FD node 303 is indicated by a reference numeral 324. Accordingly, a potential level 325 under the FD node 303 is changed to a new potential level 326. As the potential diagram 306 illustrates, the signal charge 324 is located not only in the FD node 303 but also fills the potential well formed by the implantation region 331 formed under the gate 311 of the charge transfer transistor. The signal charge filling the potential well formed by the implantation region 331 is indicated by a reference numeral 332. Some of the signal charge 324 may also spread over a barrier. When the gate 311 of the charge transfer transistor is turned off, the potential level 323 under the gate 311 of the charge transfer transistor changes back to the potential level 322. The signal charge 332 stored in the potential well formed by the implantation region 331 now flows into the FD node 303 which detects the signal charge 332 and lowers further a final potential level to a potential level 333. The potential level 333 may now be lower than a potential level 320 in a potential value as shown in the potential diagram 306.

As is now clear from the potential diagram 306, a voltage swing of the FD node 303 can be higher and not be limited on a low side by the potential level 320, i.e., an empty pinned photodiode potential level. The voltage swing of the FD node 303 is now significantly increased in comparison to the typical voltage swing. As a result, both the charge storage capacity and the voltage swing of the FD node 303 which detects the charge can be increased when a suitable compromise and optimum conditions are found. A pixel performance can thus be significantly improved without causing any penalty to an image sensor power consumption or a silicon chip area.

According to the embodiments of the present invention, a novel pixel generating a higher dynamic range (DR) and a better signal to noise ratio (SNR), and having a higher well capacity and a higher voltage swing on a FD node is described. The embodiments of the present invention can be accomplished by incorporating a potential well formed under the gate of the charge transfer transistor. This improvements and innovations are not intended to limit but to be illustrative. Also, persons skilled in this art can make modifications and variations in light of the above teaching. It is therefore to be understood that changes may be made in the particular embodiment of the present invention disclosed, which are within the scope and sprit of the invention as defined by appended claims.

For instance, it is possible to apply the embodiment of the present invention which incorporates a potential well formed under a gate of a charge transfer transistor to a row shared photo site pixel including a plurality of photodiodes connected to a FD node in parallel, and a plurality of gates of a charge transfer transistor which control a charge transfer from the photodiodes corresponding to transfer signals to the single FD node.

According to the embodiments of the present invention, a CMOS sensor array having a high charge capacity, a high dynamic range (DR), a large signal to noise ratio (SNR), and a small sized pixel can be fabricated.

While the present invention has been described with respect to the specific embodiments, it will be apparent to those skilled in the art that various changes and modifications may be made without departing from the spirit and scope of the invention as defined in the following claim.

What is claimed is:
1. A pixel of an image sensor, the pixel comprising:
a substrate having a first conductivity type;
a photodiode formed in the substrate and configured to generate and collect a photo-generated charge;
a floating diffusion region formed in the substrate, wherein the floating diffusion region has a second conductivity type and is configured to serve as a photo-generated charge-sensing node;
a charge transfer gate formed on the substrate between the photodiode and the floating diffusion region, wherein the charge transfer gate is configured to control a charge transfer from the photodiode to the floating diffusion region via a control signal; and
an implantation region having the second conductivity type, wherein the implantation region is separate from the floating diffusion region and is located under the charge transfer gate toward a side of the charge transfer gate associated with the floating diffusion region.

2. A pixel of an image sensor, the pixel comprising:
a substrate having a first conductivity type;
a photodiode formed in the substrate and configured to generate and collect a photo-generated charge;
a floating diffusion region formed in the substrate, wherein the floating diffusion region has a second conductivity type and is configured to serve as a photo-generated charge-sensing node;
a charge transfer gate formed on the substrate between the photodiode and the floating diffusion region, wherein the charge transfer gate is configured to control a charge transfer from the photodiode to the floating diffusion region via a control signal;
an implantation region having the second conductivity type, wherein the implantation region is separate from the floating diffusion region and is located under the charge transfer gate toward a side of the charge transfer gate associated with the floating diffusion region;
a reset transistor configured to reset the floating diffusion region;
a source follower transistor configured to amplify a charge signal of the floating diffusion region; and
an addressing transistor configured to select an output of the source follower transistor and to provide the selected output as a pixel output.

3. A row-shared photo-site pixel, comprising:
a substrate having a first conductivity type;
a floating diffusion region formed in the substrate, wherein the floating diffusion region has a second conductivity type and is configured to serve as a sensing node;
a plurality of photodiodes formed in the substrate and connected in parallel to the floating diffusion region;
a plurality of charge transfer gates formed on the substrate and configured to control charge transfers from the plurality of photodiodes to the floating diffusion region via a control signal; and
an implantation region having the second conductivity type, wherein the implantation region is located under a charge transfer gate from the plurality of charge transfer gates, and wherein the implantation region is separate from the floating diffusion region and is formed toward a side of the charge transfer gate associated with the floating diffusion region.

4. The pixel of claim 1, wherein the implantation region comprises an N-type implantation region.

5. The pixel of claim 1, wherein the implantation region is configured to store an excess charge, prevent the excess charge from flowing back to the photodiode, and transfer the excess charge onto the floating diffusion region when the charge transfer gate is turned off.

6. The pixel of claim 2, wherein the implantation region is configured to store an excess charge, prevent the excess charge from flowing back to the photodiode, and transfer the excess charge onto the floating diffusion region when the charge transfer gate is turned off.

7. The row-shared photo-site pixel of claim 3, wherein the implantation region is configured to store an excess charge, prevent the excess charge from flowing back to the plurality of photodiodes, and transfer the excess charge onto the floating diffusion region when the charge transfer gate from the plurality of charge transfer gates is turned off.

8. The pixel of claim 1, wherein the implantation region is not under the floating diffusion region.

9. The pixel of claim 1, further comprising a reset transfer gate that connects the floating diffusion region to a terminal, wherein the charge transfer gate is longer than the reset transfer gate.

10. The pixel of claim 1, wherein the implantation region is configured to receive the photo-generated charge, and wherein the photo-generated charge fills the implantation region and the floating diffusion region.

11. The pixel of claim 2, wherein the implantation region is not under the floating diffusion region.

12. The pixel of claim 2, further comprising a reset transfer gate that connects the floating diffusion region to a terminal, wherein the charge transfer gate is longer than the reset transfer gate.

13. The pixel of claim 2, wherein the implantation region comprises an N-type implantation region, wherein the N-type implantation region is configured to receive the photo-generated charge, and wherein the photo-generated charge fills the potential well and the floating diffusion region.

14. The row-shared photo-site pixel of claim 3, wherein the at least one implantation region is not under the floating diffusion region.

15. The row-shared photo-site pixel of claim 3, further comprising a reset transfer gate that connects the floating diffusion region to a terminal, wherein the plurality of charge transfer gates are longer than the reset transfer gate.

16. The row-shared photo-site pixel of claim 3, wherein the implantation region comprises an N-type implantation region, wherein the N-type implantation region is configured to receive a signal charge, and wherein the signal charge fills the at least one potential well and the floating diffusion region.

* * * * *

UNITED STATES PATENT AND TRADEMARK OFFICE
CERTIFICATE OF CORRECTION

| | | |
|---|---|---|
| PATENT NO. | : 8,159,011 B2 | Page 1 of 1 |
| APPLICATION NO. | : 11/711821 | |
| DATED | : April 17, 2012 | |
| INVENTOR(S) | : Hynecek | |

It is certified that error appears in the above-identified patent and that said Letters Patent is hereby corrected as shown below:

In the Specifications:

In Column 2, Line 64, delete "216" and insert -- 206 --, therefor.

Signed and Sealed this
Twenty-fifth Day of September, 2012

David J. Kappos
*Director of the United States Patent and Trademark Office*